United States Patent
Frye et al.

(10) Patent No.: US 7,906,839 B2
(45) Date of Patent: Mar. 15, 2011

(54) SEMICONDUCTOR DEVICE AND METHOD OF SHUNT TEST MEASUREMENT FOR PASSIVE CIRCUITS

(75) Inventors: Robert C. Frye, Piscataway, NJ (US); Kai Liu, Phoenix, AZ (US); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 337 days.

(21) Appl. No.: 12/167,039

(22) Filed: Jul. 2, 2008

(65) Prior Publication Data
US 2010/0001268 A1   Jan. 7, 2010

(51) Int. Cl.
*H01L 23/02* (2006.01)
(52) U.S. Cl. ......... 257/678; 257/690; 257/693; 257/723
(58) Field of Classification Search .................. 257/678, 257/690–694, 723
See application file for complete search history.

(56) References Cited

U.S. PATENT DOCUMENTS

| 6,424,028 B1 * | 7/2002 | Dickinson .................. 257/678 |
| 6,825,818 B2 | 11/2004 | Toncich |
| 7,305,223 B2 | 12/2007 | Liu et al. |

* cited by examiner

*Primary Examiner* — Fernando L Toledo
(74) *Attorney, Agent, or Firm* — Robert D. Atkins; Patent Law Group

(57) ABSTRACT

A semiconductor device has an inductor and capacitor formed on the substrate. The inductor and capacitor are electrically connected in series. The inductor is a coiled conductive layer. The capacitor has first and second conductive layers separated by an insulating layer. A first test pad and second test pad are formed on the substrate. A terminal of the inductor is coupled to the first and second test pads. A third test pad and fourth test pad are formed on the substrate. A terminal of the capacitor is coupled to the third and fourth test pads such that the inductor and capacitor are connected in shunt between the first and second test pads and the third and fourth test pads. An electrical characteristic of the inductor and capacitor such that resonant frequency and quality factor are tested using a two-port shunt measurement which negates series resistance of test probes.

30 Claims, 5 Drawing Sheets

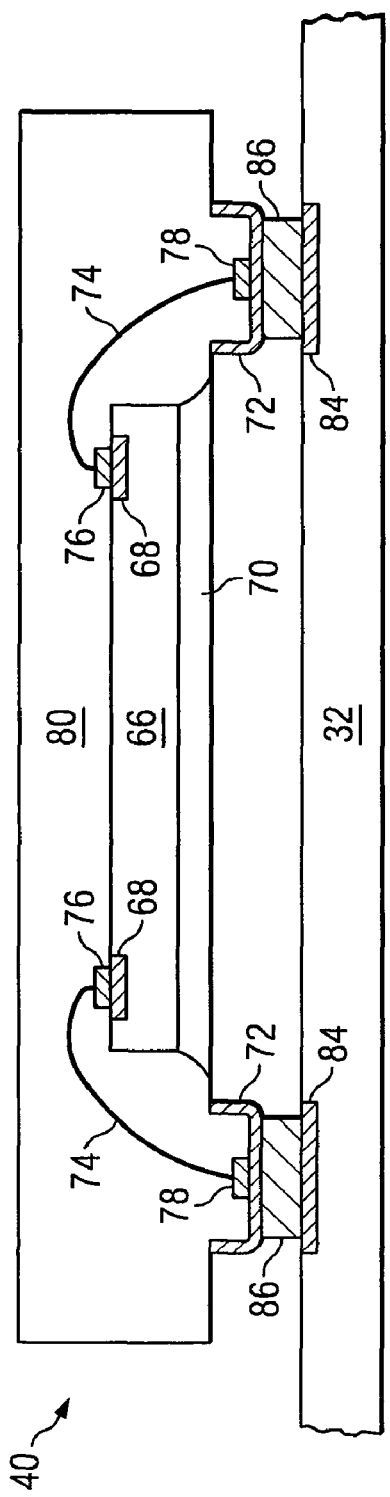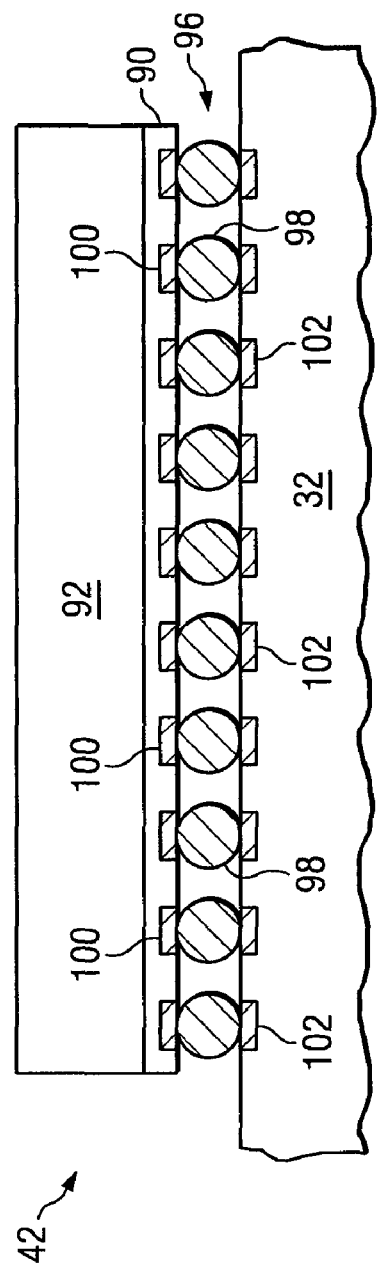

SEMICONDUCTOR DEVICE AND METHOD OF SHUNT TEST MEASUREMENT FOR PASSIVE CIRCUITS

FIELD OF THE INVENTION

The present invention relates in general to semiconductor devices and, more particularly, to a semiconductor device and method of shunt test measurement of passive circuits.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

In the design phase, it is often desirable to analyze a high frequency passive circuit to determine its characteristic parameters, i.e., impedance (Z), admittance (Y), hybrid (H), inverse hybrid (G), and scattering transmission (T) parameters. One common circuit approach is to perform a two-port network analysis. The passive circuit is evaluated as a black box with measurements taken at its two ports. The two-port analysis provides a set of distinctive properties that define its electrical behavior without considering the specific circuit schematic or individual components or their values. Any linear circuit with four terminals can be transformed into a two-port network provided that it does not contain an independent excitation source.

As one simplified example, FIG. 1 shows a two-terminal inductor and capacitor (LC) resonator 10. Resonator 10 exhibits resonance or oscillations at its natural frequency, i.e., the circuit generates higher amplitude oscillations at the resonant frequency than other frequencies. The resonator typically reacts based on physical, dielectric, or electromagnetic properties of the device. Inductor 12 and capacitor 14 are electrically coupled in series. The first port is designated by terminals 16 and 18 and the second port is designated by terminals 20 and 22. The series LC circuit represents the electrical functionality of the resonator.

During the manufacturing and testing phase, it is necessary to confirm the functional operation of resonator 10. The circuit board or substrate contains test pads arranged in accordance with terminals 16-22 of FIG. 1. The two-port network performs a series measurement of resonator 10 as the LC circuit is in series with terminals 16 and 20. A plurality of probes from a testing system is placed on the test pads to apply a voltage or inject a current into resonator 10. The test probes measure the frequency response and quality factor Q of resonator 10 with the intent of confirming that the manufactured circuit complies with the design specifications.

Unfortunately, the test probes have a series resistance which affects the test measurements. The system is measuring the reactance of inductor 12 and capacitor 14 in combination with the series resistance of the test probes. The test probe resistance introduces errors into the test system and alters the test results.

SUMMARY OF THE INVENTION

A need exists for a test measurement system that negates the series resistive contribution of the test probes. Accordingly, in one embodiment, the present invention is a method of manufacturing and testing a semiconductor device comprising the steps of providing a substrate, forming an inductor on the substrate, and forming a capacitor on the substrate. The inductor and capacitor are electrically connected in series with a first terminal of the capacitor coupled to a first terminal of the inductor. The method further includes the step of forming first and second test pads on the substrate to be electrically common. A second terminal of the inductor is coupled to the first and second test pads. The method further includes the step of forming third and fourth test pads on the substrate to be electrically common. A second terminal of the capacitor is coupled to the third and fourth test pads such that the inductor and capacitor are connected in shunt between the first and second test pads and the third and fourth test pads.

In another embodiment, the present invention is a semiconductor device comprising a substrate, an inductor formed on the substrate, and a capacitor formed on the substrate. The inductor and capacitor are electrically connected in series with a first terminal of the capacitor coupled to a first terminal of the inductor. First and second test pads are formed on the substrate to be electrically common. A second terminal of the inductor is coupled to the first and second test pads. Third and fourth test pads are formed on the substrate to be electrically common. A second terminal of the capacitor is coupled to the third and fourth test pads such that the inductor and capacitor are connected in shunt between the first and second test pads and the third and fourth test pads.

In another embodiment, the present invention is a semiconductor device comprising a substrate and passive circuit formed on the substrate. First and second test pads are formed on the substrate to be electrically common. A first terminal of the passive circuit is coupled to the first and second test pads. Third and fourth test pads are formed on the substrate to be electrically common. A second terminal of the passive circuit is coupled to the third and fourth test pads such that the passive circuit is connected in shunt between the first and second test pads and the third and fourth test pads.

In another embodiment, the present invention is a semiconductor device comprising a substrate and circuit formed on the substrate. First, second, third, and fourth test pads are formed on the substrate. The first and second test pads are electrically common. The third and fourth test pads are electrically common. The circuit is coupled in shunt between the first and second test pads and the third and fourth test pads.

BRIEF DESCRIPTION OF THE DRAWINGS

FIGS. 3a-3d illustrate a process of forming a semiconductor device with integrated passive devices;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
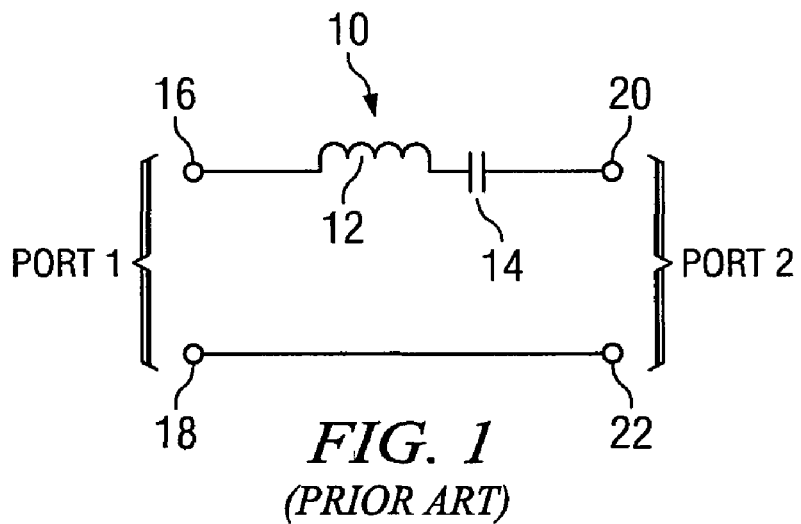
FIG. 1 is a conventional series measurement arrangement for an LC resonator.
Figure 2:
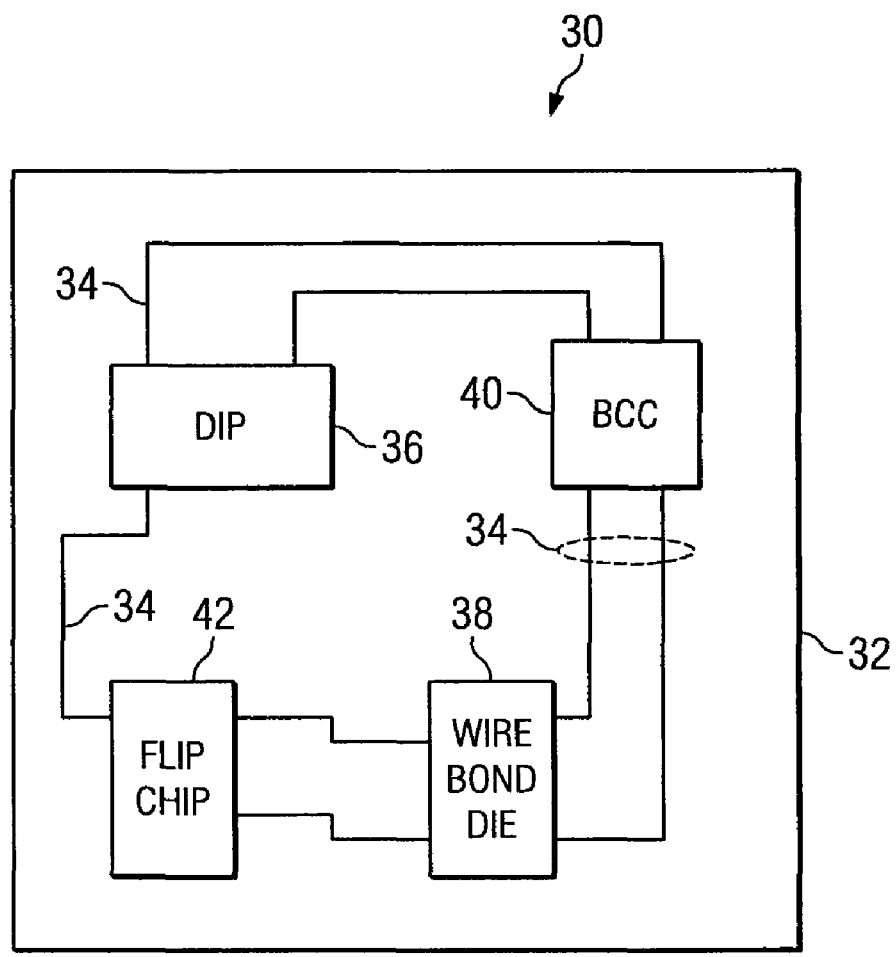
FIG. 2 illustrates an example semiconductor device.

FIG. 2 illustrates electronic device 30 having a chip carrier substrate or printed circuit board (PCB) 32 with a plurality of semiconductor packages or semiconductor die mounted on its surface. Electronic device 30 may have one type of semiconductor package, or multiple types of semiconductor packages, depending on the application. The different types of semiconductor packages are shown in FIG. 2 for purposes of illustration.

Electronic device 30 may be a stand-alone system that uses the semiconductor packages to perform an electrical function. Alternatively, electronic device 30 may be a subcomponent of a larger system. For example, electronic device 30 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 2, PCB 32 provides a general substrate for structural support and electrical interconnect of the semiconductor packages and other electronic components mounted on the PCB. Conductive signal traces 34 are formed on a surface or within layers of PCB 32 using evaporation, electrolytic plating, electroless plating, screen printing, or other suitable metal deposition process. Signal traces 34 provide for electrical communication between each of the semiconductor packages, mounted components, and any connected external system components. Traces 34 also provide power and ground connections to each of the semiconductor packages.

For the purpose of illustration, several types of semiconductor packages, including a dual in-line package (DIP) 36, wire-bonded die 38, bump chip carrier (BCC) 40, and flip chip package 42, are shown mounted on PCB 32. Depending upon the system requirements, any combination of semiconductor packages or other electronic components can be connected to PCB 32. In some embodiments, electronic device 30 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 3A:
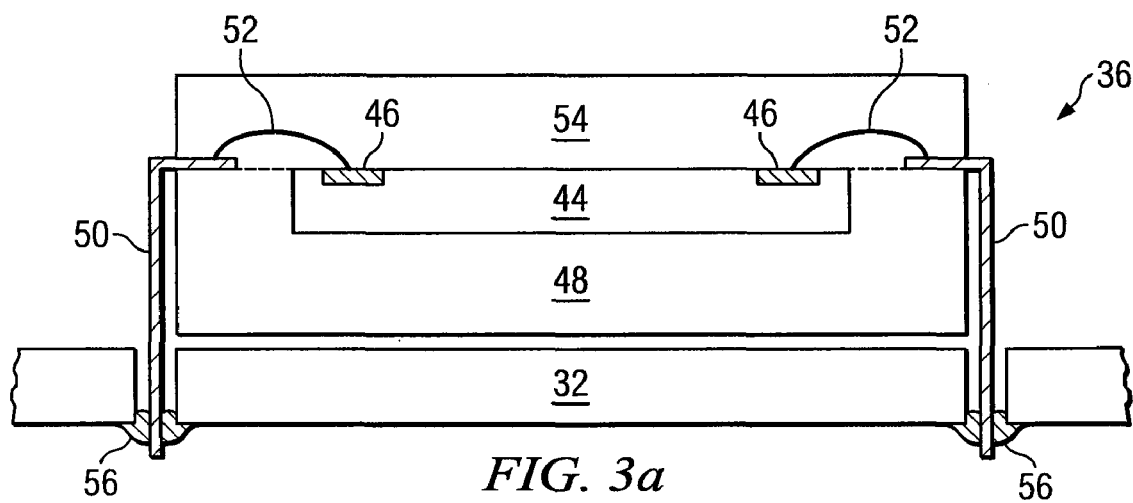

FIG. 3a illustrates further detail of DIP 36 mounted on PCB 32. DIP 36 includes semiconductor die 44 having contact pads 46. Semiconductor die 44 includes an active area containing analog or digital circuits implemented as active devices, passive devices, conductive layers, and dielectric layers formed within semiconductor die 44 and are electrically interconnected according to the electrical design of the die. For example, the circuit may include one or more transistors, diodes, inductors, capacitors, resistors, and other circuit elements formed within the active area of die 44. Contact pads 46 are conductive material such as aluminum (Al), copper (Cu), tin (Sn), nickel (Ni), gold (Au), or silver (Ag), and are electrically connected to the circuit elements formed within die 44. Contact pads 46 are formed by a physical vapor deposition (PVD), chemical vapor deposition (CVD), electrolytic plating, or electroless plating process. During assembly of DIP 36, semiconductor die 44 is mounted to a die attach area of lower portion 48 of the package body using a gold-silicon eutectic layer or adhesive material, such as thermal epoxy. The package body includes an insulative packaging material such as plastic or ceramic. Conductor leads 50 are connected to lower portion 48 of the body and bond wires 52 are formed between leads 50 and contact pads 46 of die 44. Encapsulant 54 is deposited over the package for environmental protection by preventing moisture and particles from entering the package and contaminating die 44, contact pads 46, or bond wires 52. DIP 36 is connected to PCB 32 by inserting leads 50 into holes formed through PCB 32. Solder material 56 is flowed around leads 50 and into the holes to physically and electrically connect DIP 36 to PCB 32. Solder material 56 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 3B:
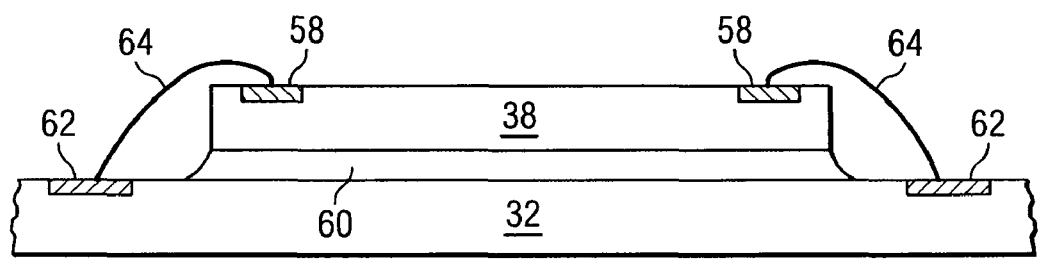

Referring to FIG. 3b, a wire-bonded die 38 having contact pads 58 is mounted to PCB 32 using adhesive material 60. Contact pads 62 are formed on the surface of PCB 32 and electrically connect to one or more traces 34 formed on or within the layers of PCB 32. Bond wires 64 are formed between contact pads 58 of die 38 and contact pads 62 of PCB 32.

FIG. 3c illustrates further detail of BCC 40 with an incorporated semiconductor die, integrated circuit (IC), or combination thereof. Semiconductor die 66 having contact pads 68 is mounted over a carrier using an underfill or epoxy-resin adhesive material 70. Semiconductor die 66 includes an active area containing analog or digital circuits implemented as active devices, passive devices, conductive layers, and dielectric layers formed within semiconductor die 66 and are electrically interconnected according to the electrical design of the die. For example, the circuit may include one or more transistors, diodes, inductors, capacitors, resistors, and other circuit elements formed within the active area of die 66. Contact pads 68 are connected to the electrical devices and circuitry formed within the active area of die 66. Bond wires 74 and bond pads 76 and 78 electrically connect contact pads 68 of die 66 to contact pads 72 of BCC 40. Mold compound or encapsulant 80 is deposited over die 66, bond wires 74 and contact pads 72 to provide physical support and electrical insulation for the device. Contact pads 84 are formed on PCB 32 and electrically connect to one or more conductive signal traces 34. Solder material is deposited between contact pads 72 of BCC 40 and contact pads 84 of PCB 32. The solder material is reflowed to form bumps 86 which form a mechanical and electrical connection between BCC 40 and PCB 32.

In FIG. 3d, flip chip style semiconductor device 42 has a semiconductor die 92 with active area 90 mounted face down toward PCB 32. Active area 90 containing analog or digital circuits implemented as active devices, passive devices, conductive layers, and dielectric layers formed within semiconductor die 92, is electrically interconnected according to the electrical design of the die. For example, the circuit may include one or more transistors, diodes, inductors, capacitors, resistors, and other circuit elements formed within active area 90 of die 92. The electrical and mechanical interconnect is achieved through solder bump structure 96 comprising a large number of individual conductive solder bumps or balls 98. The solder bumps are formed on bump pads or interconnect sites 100, which are disposed on active area 90. The bump pads 100 connect to the active circuits by conduction tracks in active area 90. The solder bumps 98 are electrically and mechanically connected to contact pads or interconnect sites 102 on PCB 32 by a solder reflow process. The interconnect sites 102 are electrically connected to one or more conductive signal traces 34 on PCB 32. The flip chip semiconductor device provides a short electrical conduction path from the active devices on die 92 to conduction tracks on PCB 32 in order to reduce signal propagation distance, lower capacitance, and achieve overall better circuit performance.

The semiconductor device contains integrated passive devices (IPD) for use in high frequency applications. For example, the IPDs can be inductors, capacitors, and resistors. A typical RF system requires multiple IPDs and other high frequency circuits in one or more semiconductor packages to perform the necessary electrical functions. For example, the IPDs contained within semiconductor devices provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. Two or more baluns are used in a quad-band for mobile phones or other global system for mobile (GSM) communications, each balun dedicated for a frequency band of operation of the quad-band device.

Figure 4:
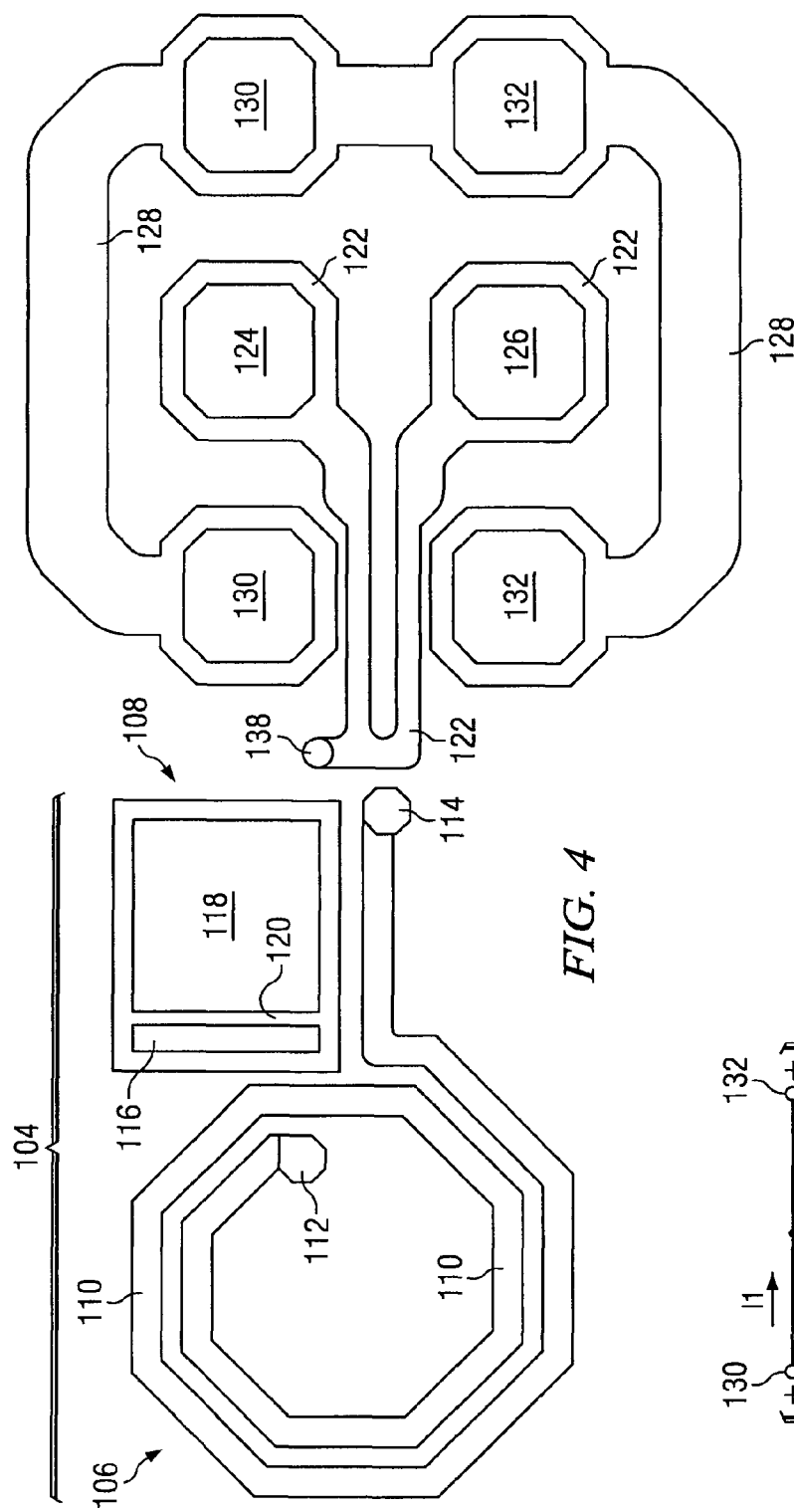
FIG. 4 is a circuit layout of an LC resonator having shunt connection to test pads for a two-port shunt measurement.

FIG. 4 is a circuit layout of a portion of the semiconductor device disposed on a multi-layered substrate. The circuit layout shows an LC resonator 104 configured as an inductor 106 in series with capacitor 108. Resonator 104 exhibits resonance or oscillations at its natural frequency, i.e., the circuit generates higher amplitude oscillations at the resonant frequency than other frequencies. The resonator typically reacts based on physical, dielectric, or electromagnetic properties of the device. The inductor 106 is made with wound or coiled metal conductive layer 110 to produce or exhibit the desired inductive properties. Conductive layer 110 is coupled to conductive vias 112 and 114 to make electrical connections through other layer(s) of the substrate. Capacitor 108 is a metal-insulator-metal (MIM) capacitor formed from conductive layers 116 and 118 separated by insulating layer 120. Conductive layer 116 is electrically isolated with respect to conductive layer 118. Conductive layers 116 and 118 operate as first and second terminals of capacitor 108. The insulating layer 120 is typically silicon dioxide ($SiO_2$), but can also be silicon nitride ($Si_3N_4$), silicon oxynitride (SiON), tantalum pentoxide ($Ta_2O_5$), zircon ($ZrO_2$), aluminum oxide ($Al_2O_3$), or other material having insulation properties. In one example, plasma deposited SiN, $Ta_2O_3$, or anodized aluminum oxide films are deposited between conductive layers 116 and 118 to increase capacitance. The deposition of insulating layer 120 may involve PVD, CVD, printing, sintering, spin coating, or thermal oxidation. Conductive layers 110, 116, and 118 can be Al, Cu, Ni, Au, Ag, or other electrically conductive material suitable for deposition on the substrate.

A conductive layer 122 is patterned and deposited over the substrate. Test pads 124 and 126 are formed on conductive layer 122. Test pads 124 and 126 are electrically common, i.e., forming a single electrical node on conductive layer 122. A conductive layer 128 is patterned and deposited over the substrate. Test pads 130 and 132 are formed on conductive layer 128. Test pads 130 and 132 are electrically common, i.e., forming a single electrical node on conductive layer 128. Conductive layer 128 is a ring common to test pads 130 and 132. Conductive layers 122 and 128 can be Al, Cu, Ni, Au, Ag, or other electrically conductive material suitable for deposition on the substrate. A PVD, CVD, electrolytic plating, or electroless plating process can be used to form conductive layers 122 and 128. Test pads 124, 126, 130, and 132 can be Al, Cu, Ni, Au, Ag, or other electrically conductive material suitable for deposition on the substrate. Test pads 124, 126, 130, and 132 are formed by PVD, CVD, electrolytic plating, electroless plating, or other suitable metal deposition process.

Conductive via 112 electrically connects a first terminal of conductive layer 110 to conductive layer 116 of capacitor 108 through other layer(s) of the substrate. Likewise, conductive via 114 electrically connects a second terminal of conductive layer 110 to conductive ring 128 and test pads 130-132 through other layer(s) of the substrate. Conductive via 138 electrically connects conductive layer 122 to conductive layer 118 of capacitor 108 through other layer(s) of the substrate.

Test pads 124, 126, 130, and 132 are provided for testing purposes. Resonator 104 is further connected to active and passive circuits on the substrate to perform the designed electrical function of the semiconductor device.

Figure 5:
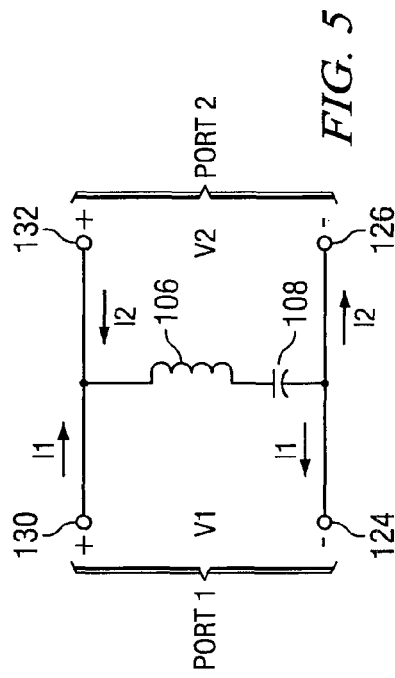
FIG. 5 is a circuit schematic of the layout of FIG. 4.

A circuit schematic representation of inductor 106 and capacitor 108 interconnection to test pads 124, 126, 130, and 132 is shown in FIG. 5. Inductor 106 and capacitor 108 are connected in series. The series LC resonator 104 is connected in shunt between test pads 124 and 126 and test pads 130 and 132. Test pads 124 and 130 represent port 1; test pads 126 and 132 represent port 2.

As part of manufacturing and testing procedures, it is necessary to evaluate and confirm the electrical characteristics of the semiconductor device according to its design specification. More specifically, the electrical characteristics of resonator 104, including the resonant frequency and quality factor Q of inductor 106 and capacitor 108, must be evaluated and confirmed. The testing procedure involves placing a test probe arrangement on test pads 124, 126, 130, and 132 in accordance with a two-port shunt measurement. As noted in the background, the test probes inherently contain a series resistance due to the length of the electrical cables. It is desirable to negate the series resistive contribution and associated error in the test measurements due to the test probes.

Using the two-port shunt measurement, the test probes apply a voltage V1 imposed across test pads 124 and 130 with + and − orientation as shown. Current I1 flows into test pad 130 and flows out test pad 124. The test probes also apply a voltage V2 imposed across test pads 126 and 132 with + and − orientation as shown. Current I2 flows into test pad 132 and flows out test pad 126. Measurements are taken by the test system. The two-port shunt measurement provides characteristics parameters, including an impedance (Z) matrix, for the passive circuit network of inductor 106 and capacitor 108. The correspondence between the characteristics of the two-port resonator circuit and measured results can be identified. The resonator electrical characteristics, such as frequency response and quality factor (Q), can be directly derived from measured parameters.

In the circuit layout of FIG. 4, the shunt configuration of the series combination of inductor 106 and capacitor 108 to test pads 124, 126, 130, and 132 substantially reduces or eliminates the series resistance of the test probe. The two-port shunt measurement as derived from the Z parameters substantially reduces or eliminates the series resistive contribution of the test probes because the series LC resonator is arranged in shunt with respect to test pads 124, 126, 130, and 132. The test probe series resistance is cancelled and does not contribute to the shunt measurement. Accordingly, the two-port shunt measurement evaluates the contribution of the reactance of the series LC resonator to the electrical characteristic being tested, independent of the test probe series resistance, which substantially improves the accuracy of the test measurements for the shunt configuration.

Figure 6:
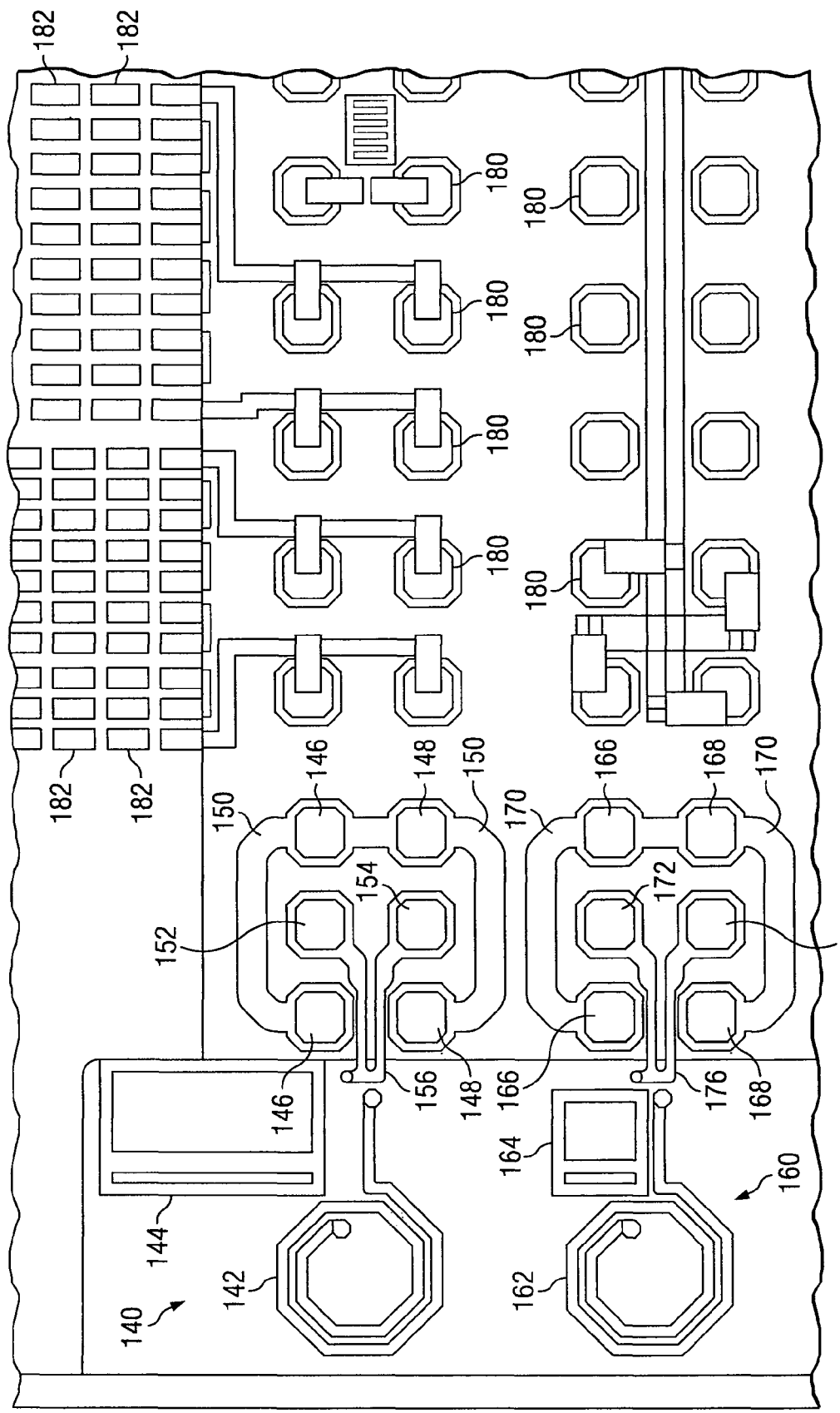
FIG. 6 illustrates a circuit layout with multiple LC resonators having shunt connection to respective test pads for a two-port shunt measurement.

FIG. 6 illustrates multiple resonators formed on the substrate. Each resonator is designed to operate at a specific resonant frequency. Resonator 140 includes inductor 142 and capacitor 144 connected in series, similar to FIG. 4. Inductor 142 is electrically coupled to test pads 146 and 148 formed on conductive ring 150. Capacitor 144 is electrically coupled to test pads 152 and 154 formed on conductive layer 156. Resonator 160 includes inductor 162 and capacitor 164 connected in series, similar to FIG. 4. Inductor 162 is electrically coupled to test pads 166 and 168 formed on conductive ring 170. Capacitor 164 is electrically coupled to test pads 172 and 174 formed on conductive layer 176. Other active and passive circuit elements 182 and interconnects 180 can be formed on the substrate as part of the electrical functionality of the semiconductor device.

Test pads 146, 148, 152, 154, 166, 168, 172, and 174 can be Al, Cu, Ni, Au, Ag, or other electrically conductive material suitable for deposition on the substrate. Test pads 146, 148, 152, 154, 166, 168, 172, and 174 are formed by PVD, CVD, electrolytic plating, electroless plating, or other suitable metal deposition process. Test pads 146, 148, 152, 154, 166, 168, 172, and 174 are provided for testing purposes. Resonators 140 and 160 are further connected to active and passive circuits on the substrate to perform the designed electrical function of the semiconductor device.

As described in FIGS. 4 and 5, a test probe arrangement is placed on test pads 146, 148, 152, and 154 in accordance with a two-port shunt measurement. The voltage V1 and V2 and currents I1 and I2 are applied to test pads 146, 148, 152, and 154 and measurements are taken by the test system. In a similar manner, a test probe arrangement is placed on test pads 166, 168, 172, and 174 in accordance with the two-port shunt measurement. The voltage V1 and V2 and currents I1 and I2 are applied to test pads 166, 168, 172, and 174 and measurements are taken by the test system. As with the circuit layout of FIG. 4, the shunt configuration of each series LC resonator to respective test pads 146, 148, 152, 154, 166, 168, 172, and 174 substantially reduces or eliminates the series resistance of the test probe. The two-port shunt measurement as derived from the Z parameters eliminates the series resistive contribution of the test probes because each series LC resonator is arranged in shunt with respect to the test pads. The test probe series resistance is cancelled and does not contribute to the shunt measurement. Accordingly, the two-port shunt measurement evaluates the contribution of the reactance of the series LC resonator to the electrical characteristic being tested, independent of the test probe series resistance, which substantially improves the accuracy of the test measurements for the shunt configuration.

Although the above explanation is directed to a series LC resonator, the two-port shunt measurement technique discussed herein is applicable to any combination of series and/or parallel passive circuit elements. The combination of passive circuit elements are seen as a two-terminal black box connected in shunt to the two-port test measurement system. By arranging the passive circuit in shunt with the test pads, the series resistance of the test probes is negated.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of manufacturing and testing a semiconductor device, comprising:
   providing a substrate;
   forming an inductor on the substrate;
   forming a capacitor on the substrate, the inductor and capacitor being electrically connected in series with a first terminal of the capacitor being coupled to a first terminal of the inductor;
   forming first and second test pads on the substrate to be electrically common, wherein a second terminal of the inductor is coupled to the first and second test pads; and
   forming third and fourth test pads on the substrate to be electrically common, wherein a second terminal of the capacitor is coupled to the third and fourth test pads such that the inductor and capacitor are connected in shunt between the first and second test pads and the third and fourth test pads.

2. The method of claim 1, further including:
   forming a coiled conductive layer for the inductor;
   forming first and second conductive layers, the first conductive layer being electrically isolated from the second conductive layer; and
   forming an insulating layer between the first and second conductive layers for the capacitor.

3. The method of claim 1, further including testing an electrical characteristic of the inductor and capacitor using test probes to perform a two-port shunt measurement by applying a first voltage across the first and third test pads and applying a second voltage across the second and fourth test pads such that a first current flows through the first and third test pads and a second current flows through the second and fourth test pads.

4. The method of claim 3, wherein the shunt measurement negates series resistance of the test probes when determining the electrical characteristic of the inductor and capacitor.

5. The method of claim 4, wherein the electrical characteristic is resonant frequency or quality factor.

6. A semiconductor device, comprising:
   a substrate;
   an inductor formed on the substrate;
   a capacitor formed on the substrate, the inductor and capacitor being electrically connected in series with a first terminal of the capacitor being coupled to a first terminal of the inductor;
   first and second test pads formed on the substrate to be electrically common, wherein a second terminal of the inductor is coupled to the first and second test pads; and
   third and fourth test pads formed on the substrate to be electrically common, wherein a second terminal of the capacitor is coupled to the third and fourth test pads such that the inductor and capacitor are connected in shunt between the first and second test pads and the third and fourth test pads.

7. The semiconductor device of claim 6, wherein the inductor includes a coiled conductive layer and the capacitor includes first and second conductive layers and an insulating layer disposed between the first and second conductive layers.

8. The semiconductor device of claim 6, further including:
   a first conductive via electrically connecting the first terminal of the inductor to the first terminal of the capacitor;
   a second conductive via electrically connecting the second terminal of the inductor to the first and second test pads; and
   a third conductive via electrically connecting the second terminal of the capacitor to the third and fourth test pads.

9. The semiconductor device of claim 6, wherein an electrical characteristic of the inductor and capacitor is tested using test probes to perform a two-port shunt measurement by applying a first voltage across the first and third test pads and applying a second voltage across the second and fourth test pads such that a first current flows through the first and third test pads and a second current flows through the second and fourth test pads.

10. The semiconductor device of claim 9, wherein the shunt measurement negates series resistance of the test probes when determining the electrical characteristic of the inductor and capacitor.

11. The semiconductor device of claim 10, wherein the electrical characteristic is resonant frequency or quality factor.

12. A semiconductor device, comprising:
    a substrate;
    a passive circuit formed on the substrate;
    first and second test pads formed on the substrate to be electrically common, wherein a first terminal of the passive circuit is coupled to the first and second test pads; and
    third and fourth test pads formed on the substrate to be electrically common, wherein a second terminal of the passive circuit is coupled to the third and fourth test pads such that the passive circuit is connected in shunt between the first and second test pads and the third and fourth test pads.

13. The semiconductor device of claim 12, wherein the passive circuit includes:
    an inductor formed on the substrate; and
    a capacitor formed on the substrate, the inductor and capacitor being electrically connected in series with a first terminal of the capacitor being coupled to a first terminal of the inductor.

14. The semiconductor device of claim 13, wherein the inductor includes a coiled conductive layer and the capacitor includes first and second conductive layers and an insulating layer disposed between the first and second conductive layers.

15. The semiconductor device of claim 13, further including:
    a first conductive via electrically connecting the first terminal of the inductor to the first terminal of the capacitor;
    a second conductive via electrically connecting a second terminal of the inductor to the first and second test pads; and
    a third conductive via electrically connecting a second terminal of the capacitor to the third and fourth test pads.

16. The semiconductor device of claim 12, wherein an electrical characteristic of the passive circuit is tested using test probes to perform a two-port shunt measurement by applying a first voltage across the first and third test pads and applying a second voltage across the second and fourth test pads such that a first current flows through the first and third test pads and a second current flows through the second and fourth test pads.

17. The semiconductor device of claim 16, wherein the shunt measurement negates series resistance of the test probes when determining the electrical characteristic of the passive circuit.

18. The semiconductor device of claim 17, wherein the electrical characteristic is resonant frequency or quality factor.

19. A semiconductor device, comprising:
a substrate;
a circuit formed on the substrate, the circuit including,
  (a) an inductor formed on the substrate, and
  (b) a capacitor formed on the substrate, the inductor and capacitor being electrically connected in series with a first terminal of the capacitor being coupled to a first terminal of the inductor;
first, second, third, and fourth test pads formed on the substrate, the first and second test pads being electrically common and coupled to a second terminal of the capacitor, the third and fourth test pads being electrically common and coupled to a second terminal of the inductor, the circuit being coupled in shunt between the first and second test pads and the third and fourth test pads;
a first conductive via electrically connecting the first terminal of the inductor to the first terminal of the capacitor;
a second conductive via electrically connecting a second terminal of the inductor to the first and second test pads; and
a third conductive via electrically connecting a second terminal of the capacitor to the third and fourth test pads.

20. The semiconductor device of claim 19, wherein the inductor includes a coiled conductive layer and the capacitor includes first and second conductive layers and an insulating layer disposed between the first and second conductive layers.

21. The semiconductor device of claim 19, wherein an electrical characteristic of the circuit is tested using test probes to perform a two-port shunt measurement by applying a first voltage across the first and third test pads and applying a second voltage across the second and fourth test pads such that a first current flows through the first and third test pads and a second current flows through the second and fourth test pads.

22. The semiconductor device of claim 21, wherein the shunt measurement negates series resistance of the test probes when determining the electrical characteristic of the circuit.

23. The semiconductor device of claim 22, wherein the electrical characteristic is resonant frequency or quality factor.

24. A semiconductor device, comprising:
a substrate;
a passive circuit formed on the substrate; and
first, second, third, and fourth test pads formed on the substrate, the first and second test pads being electrically common and coupled to a first terminal of the passive circuit, the third and fourth test pads being electrically common and coupled to a second terminal of the passive circuit, the passive circuit being coupled in shunt between the first and second test pads and the third and fourth test pads.

25. The semiconductor device of claim 24, wherein the passive circuit includes:
an inductor formed on the substrate; and
a capacitor formed on the substrate, the inductor and capacitor being electrically connected in series with a first terminal of the capacitor being coupled to a first terminal of the inductor.

26. The semiconductor device of claim 25, wherein the inductor includes a coiled conductive layer and the capacitor includes first and second conductive layers and an insulating layer disposed between the first and second conductive layers.

27. The semiconductor device of claim 25, further including:
a first conductive via electrically connecting the first terminal of the inductor to the first terminal of the capacitor;
a second conductive via electrically connecting a second terminal of the inductor to the first and second test pads; and
a third conductive via electrically connecting a second terminal of the capacitor to the third and fourth test pads.

28. The semiconductor device of claim 24, wherein an electrical characteristic of the passive circuit is tested using test probes to perform a two-port shunt measurement by applying a first voltage across the first and third test pads and applying a second voltage across the second and fourth test pads such that a first current flows through the first and third test pads and a second current flows through the second and fourth test pads.

29. The semiconductor device of claim 28, wherein the shunt measurement negates series resistance of the test probes when determining the electrical characteristic of the passive circuit.

30. The semiconductor device of claim 29, wherein the electrical characteristic is resonant frequency or quality factor.

* * * * *